US011502068B2

(12) United States Patent
Carpenter et al.

(10) Patent No.: US 11,502,068 B2
(45) Date of Patent: Nov. 15, 2022

(54) SEMICONDUCTOR DEVICE PACKAGE HAVING GALVANIC ISOLATION AND METHOD THEREFOR

(71) Applicant: NXP USA, INC., Austin, TX (US)

(72) Inventors: Burton Jesse Carpenter, Austin, TX (US); Fred T. Brauchler, Canton, MI (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/190,542

(22) Filed: Mar. 3, 2021

(65) Prior Publication Data
US 2022/0285330 A1    Sep. 8, 2022

(51) Int. Cl.
| | |
|---|---|
| H01L 25/16 | (2006.01) |
| H01L 23/64 | (2006.01) |
| H01L 23/00 | (2006.01) |
| H01L 23/498 | (2006.01) |

(52) U.S. Cl.
CPC ........ H01L 25/16 (2013.01); H01L 23/49816 (2013.01); H01L 23/645 (2013.01); H01L 24/48 (2013.01); *H01L 2224/48195* (2013.01)

(58) Field of Classification Search
CPC . H01L 25/16; H01L 23/49816; H01L 23/645; H01L 24/48; H01L 2224/48195
See application file for complete search history.

(56) References Cited

U.S. PATENT DOCUMENTS

| | | | |
|---|---|---|---|
| 9,035,422 B2 | 5/2015 | Khanolkar et al. | |
| 9,219,028 B1 | 12/2015 | Higgins, III et al. | |
| 9,362,987 B2 | 6/2016 | Brauchler et al. | |
| 10,446,476 B2 | 10/2019 | Higgins, III et al. | |
| 2011/0254123 A1* | 10/2011 | Sellathamby | H01L 23/645 257/E23.01 |
| 2012/0168901 A1 | 7/2012 | Santangelo et al. | |
| 2015/0115405 A1 | 4/2015 | Wu et al. | |
| 2016/0190052 A1* | 6/2016 | Ruben | A61N 1/3754 174/262 |
| 2019/0045623 A1* | 2/2019 | Sutono | H01L 23/5386 |
| 2019/0273066 A1* | 9/2019 | Kuwabara | H01L 23/49575 |
| 2019/0385780 A1 | 12/2019 | Xu | |
| 2020/0052393 A1* | 2/2020 | Fang | H01Q 9/0414 |
| 2021/0111088 A1 | 4/2021 | Jain et al. | |

OTHER PUBLICATIONS

U.S. Appl. No. 17/034,201, filed Sep. 28, 2020, and entitled "Semiconductor Device Package Having Galvanic Isolation and Method Therefor".
Non-final office action dated Oct. 1, 2021 in U.S. Appl. No. 17/034,201.

* cited by examiner

*Primary Examiner* — Douglas W Owens (57) ABSTRACT

A semiconductor device package having galvanic isolation is provided. The semiconductor device includes a package substrate having a first inductive coil formed from a first conductive layer and a second inductive coil formed from a second conductive layer. The first conductive layer and the second conductive layer are separated by a non-conductive material. A first semiconductor die is attached to a first major side of the package substrate. The first semiconductor die is conductively interconnected to the first inductive coil. A second semiconductor die is attached to the first major side of the package substrate. A first wireless communication link between the first semiconductor die and the second semiconductor die is formed by way of the first and second inductive coils.

20 Claims, 7 Drawing Sheets

SEMICONDUCTOR DEVICE PACKAGE HAVING GALVANIC ISOLATION AND METHOD THEREFOR

BACKGROUND

Field

This disclosure relates generally to semiconductor device packaging, and more specifically, to a semiconductor device package having galvanic isolation and method of forming the same.

Related Art

Today, there is an increasing trend to include sophisticated semiconductor devices in products and systems that are used every day. These sophisticated semiconductor devices may include wireless communication between integrated circuit (IC) die. In such applications, electrical (or galvanic) isolation is desired between the die. "Galvanic isolation" generally means that there is no direct current (DC) electrically conductive path between distinct circuits. For example, galvanic isolation may be desired to protect a first IC die that operates at a first supply voltage from a second IC die that operates at a second supply voltage different from the first IC die.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package having galvanic isolation. The packaged semiconductor device includes a first semiconductor die and a second semiconductor die attached to a package substrate. The two semiconductor die are configured to communicate and/or transfer power with one another by way of inductive coils located in the package substrate. In this manner, the two semiconductor die are isolated from one another such that if an electrical over stress (EOS) event damaged the first semiconductor die, the second semiconductor die would remain electrically isolated from the first semiconductor die.

Figure 1A:
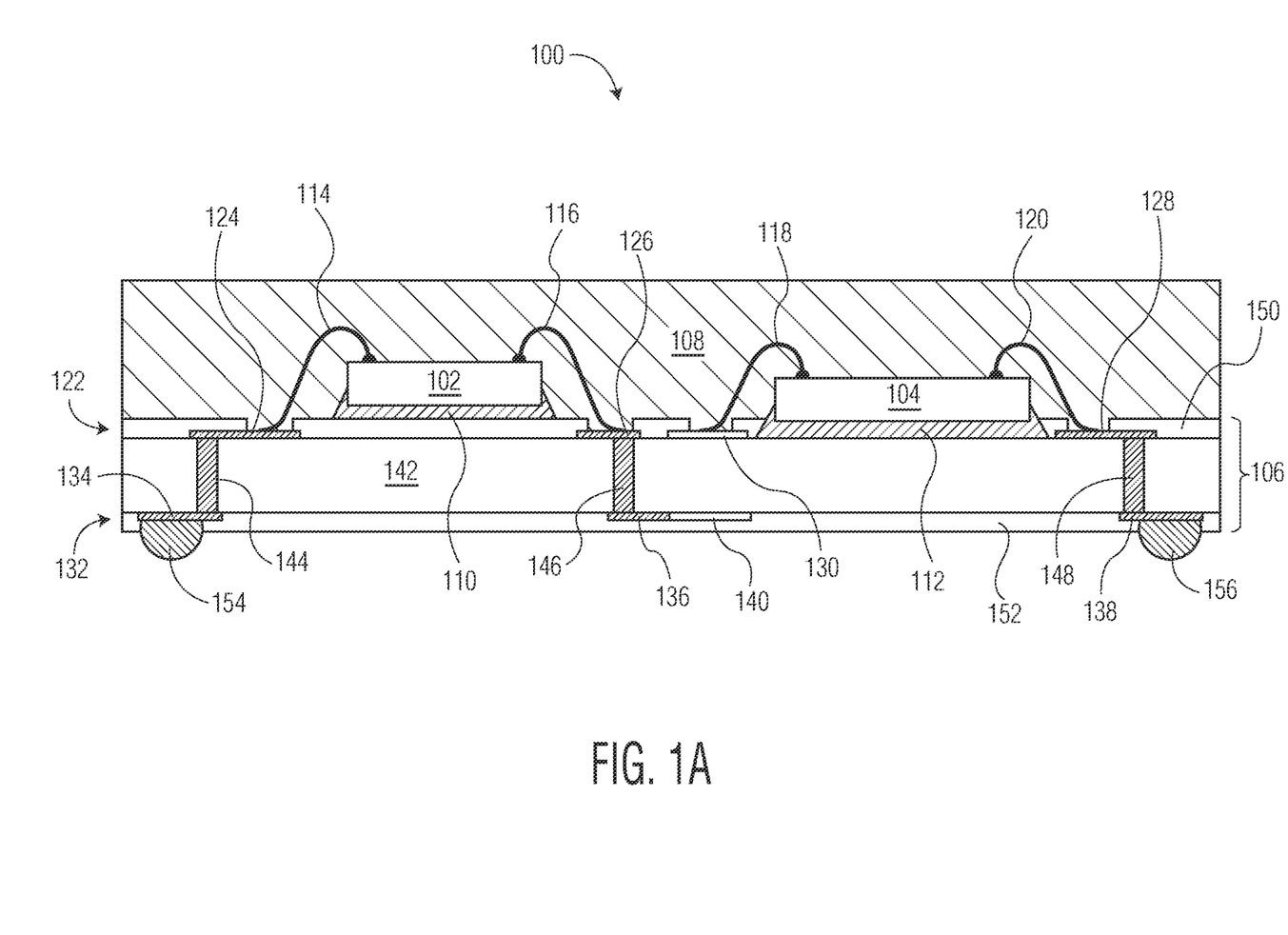
FIG. 1A through FIG. 1C illustrate, in simplified cross-sectional view and corresponding plan views, an example semiconductor device having galvanic isolation in accordance with an embodiment.
Figure 1B:
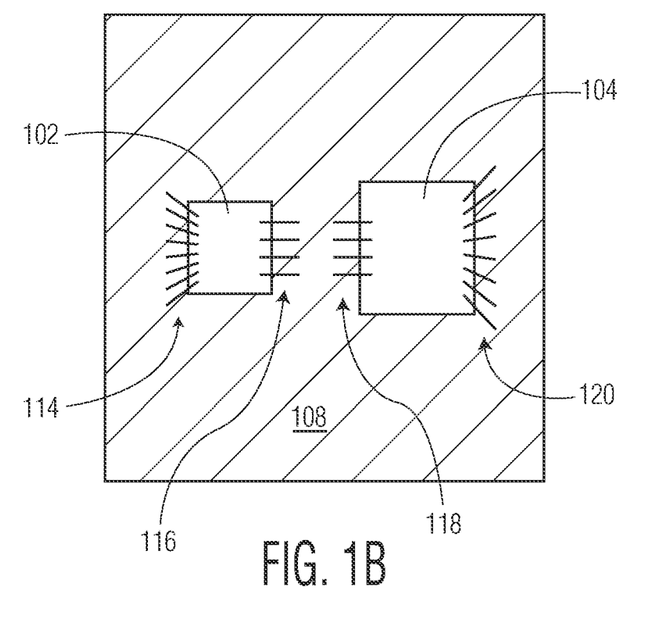
Figure 1C:
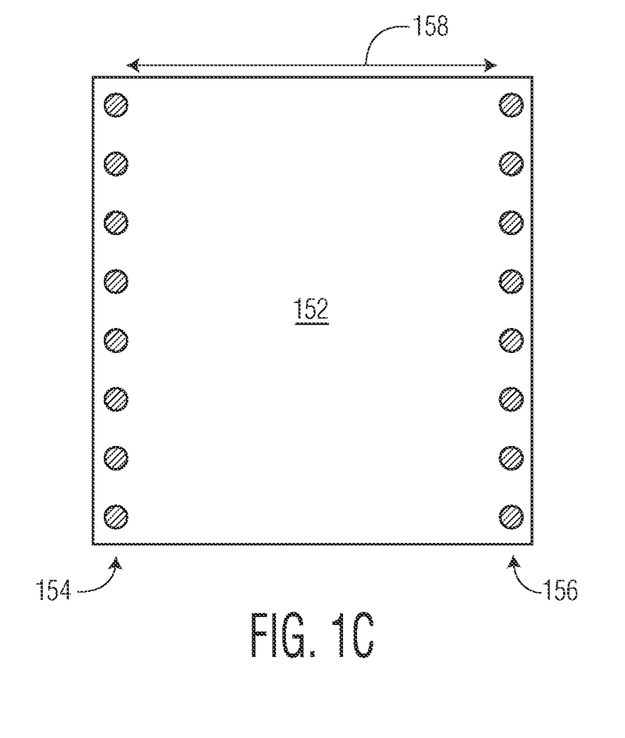

FIG. 1A through FIG. 1C illustrate, in simplified cross-sectional view and corresponding plan views, an example semiconductor device 100 having galvanic isolation in accordance with an embodiment. In this embodiment, the device 100 includes a first semiconductor die 102 and a second semiconductor die 104 attached to a package substrate 106 and encapsulated with an encapsulant 108. FIG. 1A shows the cross-sectional view of device 100, and the corresponding top side and bottom side plan views of package 100 are depicted in FIG. 1B and FIG. 1C respectively. A wireless communication link is formed between the first semiconductor die 102 and the second semiconductor die 104 by way of a first inductive coil 130 and a second inductive coil 140 configured and arranged for inductive coupling within the package substrate 106.

The semiconductor die 102 has an active side (e.g., major side having circuitry) and a backside (e.g., major side opposite of the active side). In this embodiment, the backside of the semiconductor die 102 is attached to the package substrate by way of die attach material 110. The semiconductor die 102 includes bond pads (not shown) at the active side configured for conductive connection to conductive features (e.g., conductive traces 124 and 126) of the package substrate 106 by way of bond wires 114 and 116, for example. The semiconductor die 102 may be formed from any suitable semiconductor material, such as silicon, germanium, gallium arsenide, gallium nitride, silicon carbide, and the like. In this embodiment, the semiconductor die 102 may be characterized as a low voltage die, for example. The term "low voltage" as used herein generally refers to an operating voltage in a first voltage domain, for example, sufficient for operation of CMOS digital circuitry. In this embodiment, the semiconductor die 102 may serve as a controller device configured to control functions of the semiconductor die 104 by way of the wireless communication link.

The semiconductor die 104 has an active side (e.g., major side having circuitry) and a backside (e.g., major side opposite of the active side). In this embodiment, the backside of the semiconductor die 104 is attached to the package substrate by way of die attach material 112. The semiconductor die 104 includes bond pads (not shown) at the active side configured for conductive connection to conductive features (e.g., inductive coil 130 and conductive trace 128) of the package substrate 106 by way of bond wires 118 and 120, for example. The semiconductor die 104 may be formed from any suitable semiconductor material, such as silicon, germanium, gallium arsenide, gallium nitride, silicon carbide, and the like. In this embodiment, the semiconductor die 104 may be characterized as a high voltage die, for example. The term "high voltage" as used herein generally refers to an operating voltage in a second voltage domain sufficient for operation of circuitry such as insulated-gate bipolar transistors (IGBT), for example. In this embodiment, the second voltage domain is different from the first voltage domain, for example, having voltage values different from the first voltage domain. The second voltage domain may be electrically isolated and offset from the first voltage domain. For example, the second voltage domain may be offset from the first voltage domain by ~400 volts, ~800 volts, or other voltages. In this embodiment, the semiconductor die 104 is configured for receiving commands from and/or transferring information with the semiconductor die 102 by way of the wireless communication link.

The package substrate 106 has a first major side (e.g., top side) and a second major side (e.g., bottom side) opposite of the first major side. In this embodiment, the package substrate 106 is formed as a multi-layer laminate structure having a plurality of conductive layers separated by non-conductive material. For example, the package substrate 106 includes a first conductive layer (e.g., metal) 122 located at the first major side and a second conductive layer 132 located at the second major side. The conductive layer 122 and the conductive layer 132 are separated by a non-conductive material (e.g., fiber reinforced epoxy material) 142. In this embodiment, the conductive layer 122 is patterned to form conductive traces 124-128 and the inductive coil 130. The conductive layer 132 is patterned to form conductive traces 134-138 and the inductive coil 140. The package substrate 106 may include any number of inductive coils 130 and 140 configured to form inductive coupling. Conductive vias 144-148 are formed to provide conductive connections between the conductive traces 124-128 and the conductive traces 134-138, for example. The inductive coil 130 and the inductive coil 140 are substantially aligned with one another within the package substrate 106 to allow for communication by way of inductive coupling.

A first solder mask layer 150 is formed embedding the conductive traces 124-128 and the inductive coil 130. Openings formed in the solder mask layer 150 expose portions of the conductive traces 124-128 and a conductive trace portion connected to the inductive coil 130 forming substrate pads. The exposed substrate pads allow for connections to the semiconductor die 102 and 104 by way of respective bond wires 114-120, for example. In the embodiment depicted in FIG. 1A, the semiconductor die 102 is attached on the solder mask layer 150 and the semiconductor die 104 is attached on the non-conductive material 142 through an opening in the solder mask layer 150. In other embodiments, one or both of semiconductor die 102 and 104 may be attached on the solder mask layer 150 or attached on the non-conductive material 142. A second solder mask layer 152 is formed embedding the conductive traces 134-138 and the inductive coil 140. Openings formed in the solder mask layer 152 expose portions of the conductive traces 134 and 138 forming connector pads to allow for connections to a printed circuit board (PCB) by way of respective ball connectors 154 and 156, for example. The ball connectors 154 and 156 may be any suitable conductive structure such as solder balls, gold studs, copper pillars, and the like, to connect conductive features of the device 100 with the PCB. In this embodiment, the package substrate 106 serves as a mechanical carrier, isolation barrier, and external interconnect for device 100.

As depicted in FIG. 1A, the encapsulant 108 (e.g., epoxy molding compound) encapsulates the semiconductor die 102, the semiconductor die 104, the bond wires 114-120, and exposed portions of the top side of the package substrate 106. For illustration purposes, the top side plan view (FIG. 1B) of the device 100 shows the active sides of the semiconductor die 102 and the semiconductor die 104, and portions of bond wires 114-120 revealed through the encapsulant 108. The encapsulated semiconductor die 102 and semiconductor die 104 are separated from one another by a distance sufficient to provide desired isolation (e.g., >5 kV for 60 seconds). In this embodiment, the semiconductor die 102 and the semiconductor die 104 are separated by a predetermined distance of at least 500 microns to accommodate desired isolation requirements. In other embodiments, the semiconductor die 102 and the semiconductor die 104 may be separated by other predetermined distances to accommodate desired requirements depending upon properties of the encapsulant and solder mask materials, for example. The bottom side plan view (FIG. 1C) of the device 100 shows an example ball grid array (BGA) of the ball connectors 154 and 156 arranged at the bottom side of the package substrate 106. A clearance distance is indicated by arrow labeled 158. In this embodiment, the device 100 is configured with a predetermined clearance distance of approximately 8 millimeters to accommodate desired requirements. In other embodiments, it may be desirable to configure the device 100 with other clearance distance values.

In this embodiment, a wireless communication link is formed between semiconductor die 102 and semiconductor die 104 by way of the inductive coils 130 and 140 embedded in the package substrate 106. The communication link includes a signal path configured to allow communication between the semiconductor die 102 and the semiconductor die 104 while being galvanically isolated from one another. For example, the signal path includes inductive coils 130 and 140 substantially aligned to form an inductive coupling within the package substrate 106. The signal path further includes the conductive traces 126 and 136, via 146, and bond wire 116 interconnecting the semiconductor die 102 with the inductive coil 140 and bond wire 118 interconnecting the semiconductor die 104 with the inductive coil 130.

Figure 2:
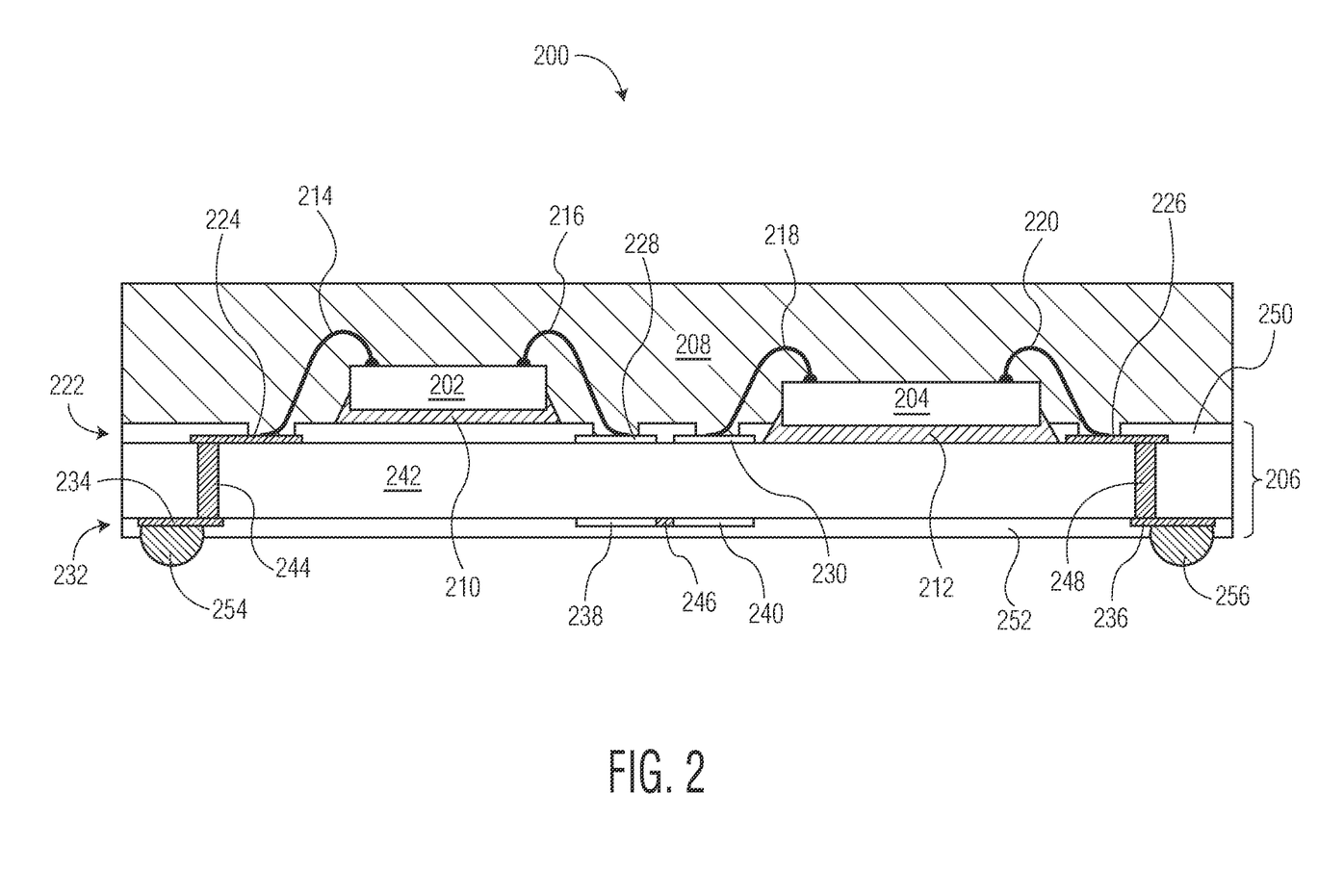
FIG. 2 illustrates, in a simplified cross-sectional view, an alternative example semiconductor device having galvanic isolation in accordance with an embodiment.

FIG. 2 illustrates, in a simplified cross-sectional view, an alternative example semiconductor device having galvanic isolation in accordance with an embodiment. In this embodiment, the device 200 includes a first semiconductor die 202 and a second semiconductor die 204 attached to a package substrate 206 and encapsulated with an encapsulant 208. A first inductive coupling within the package substrate 206 is formed by way of a first inductive coil 228 and a second inductive coil 238, and a second inductive coupling within the package substrate 206 is formed by way of a third inductive coil 230 and a fourth inductive coil 240. The first and second inductive couplings are connected in series to form a wireless communication link between the first semiconductor die 202 and the second semiconductor die 204.

The semiconductor die 202 has an active side and a backside. In this embodiment, the backside of the semiconductor die 202 is attached to the package substrate by way of die attach material 210. The semiconductor die 202 includes bond pads (not shown) at the active side configured for conductive connection to conductive features (e.g., conductive trace 224 and inductive coil 228) of the package substrate 206 by way of bond wires 214 and 216, for example. The semiconductor die 202 may be formed from any suitable semiconductor material, such as silicon, germanium, gallium arsenide, gallium nitride, silicon carbide, and the like. In this embodiment, the semiconductor die 202 may be characterized as a low voltage die having an operating voltage in a first voltage domain sufficient for operation of CMOS digital circuitry, for example. In this embodiment, the semiconductor die 202 may serve as a controller device configured to control functions of the semiconductor die 204 by way of the wireless communication link.

The semiconductor die 204 has an active side and a backside. In this embodiment, the backside of the semiconductor die 204 is attached to the package substrate by way of die attach material 212. The semiconductor die 204 includes bond pads (not shown) at the active side configured for conductive connection to conductive features (e.g., inductive coil 230 and conductive trace 226) of the package substrate 206 by way of bond wires 218 and 220, for example. The semiconductor die 204 may be formed from any suitable semiconductor material, such as silicon, germanium, gallium arsenide, gallium nitride, silicon carbide, and the like. In this embodiment, the semiconductor die 204 may be characterized as a high voltage die having an operating voltage in a second voltage domain different from the first voltage domain sufficient for operation of circuitry such as insulated-gate bipolar transistors (IGBT), for example. The second voltage domain may be electrically isolated and offset from the first voltage domain. In this embodiment, the semiconductor die 204 is configured for receiving commands from and/or transferring information with the semiconductor die 202 by way of the wireless communication link.

The package substrate 206 has a first major side and a second major side opposite of the first major side. In this embodiment, the package substrate 206 is formed as a multi-layer laminate structure. For example, the package substrate 206 includes a first conductive layer (e.g., metal) 222 located at the first major side and a second conductive layer 232 located at the second major side. The conductive layer 222 and the conductive layer 232 are separated by a non-conductive material (e.g., fiber reinforced epoxy material) 242. In this embodiment, the conductive layer 222 is patterned to form conductive traces 224-226 and inductive coils 228-230. The conductive layer 232 is patterned to form conductive traces 234-236, 246 and inductive coils 238-240. The package substrate 206 may include any number of inductive coils 228-230 and 238-240 configured to form inductive coupling. Conductive vias 244 and 248 are formed to provide conductive connections between the conductive traces 224-226 and the conductive traces 234-236, for example. The inductive coil 228 and the inductive coil 238 are substantially aligned with one another within the package substrate 206 to allow for communication by way of inductive coupling. Likewise, the inductive coil 230 and the inductive coil 240 are substantially aligned with one another within the package substrate 206 to allow for communication by way of inductive coupling.

A first solder mask layer 250 is formed embedding the conductive traces 224 and 226 and the inductive coils 228 and 230. Openings formed in the solder mask layer 250 expose portions of the conductive traces 224 and 226 and conductive trace portions connected to the inductive coils 228 and 230 forming substrate pads. The exposed substrate pads allow for connections to the semiconductor die 202 and 204 by way of respective bond wires 214-220, for example. A second solder mask layer 252 is formed embedding the conductive traces 234-236, 246 and the inductive coils 238-240. Openings formed in the solder mask layer 252 expose portions of the conductive traces 234 and 236 forming connector pads to allow for connections to a printed circuit board (PCB) by way of respective ball connectors 254 and 256, for example. The ball connectors 254 and 256 may be any suitable conductive structure such as solder balls, gold studs, copper pillars, and the like, to connect conductive features of the device 200 with the PCB. In this embodiment, the package substrate 206 serves as a mechanical carrier, isolation barrier, and external interconnect for device 200.

The encapsulant 208 (e.g., epoxy molding compound) encapsulates the semiconductor die 202, the semiconductor die 204, the bond wires 214-220, and exposed portions of the top side of the package substrate 206. The encapsulated semiconductor die 202 and semiconductor die 204 are separated from one another by a distance sufficient to provide desired isolation. In this embodiment, the semiconductor die 202 and the semiconductor die 204 are separated by a predetermined distance to accommodate desired requirements.

In this embodiment, a wireless communication link is formed between semiconductor die 202 and semiconductor die 204 by way of the inductive coils 228-230 and 238-240 embedded in the package substrate 206. The communication link includes a signal path configured to allow wireless communication between the semiconductor die 202 and the semiconductor die 204 while being galvanically isolated from one another. For example, the signal path includes a first set of inductive coils 228 and 238 substantially aligned to form the first inductive coupling within the package substrate 206 and a second set of inductive coils 230 and 240 substantially aligned to form the second inductive coupling within the package substrate 206. Conductive trace 246 interconnects inductive coils 238 and 240 thus forming a series connection of the first set of inductive coils with the second set of inductive coils coupled between the semiconductor die 202 and the semiconductor die 204. The signal path further includes the bond wire 216 interconnecting the semiconductor die 202 with the inductive coil 228 and bond wire 218 interconnecting the semiconductor die 204 with the inductive coil 230.

Figure 3:
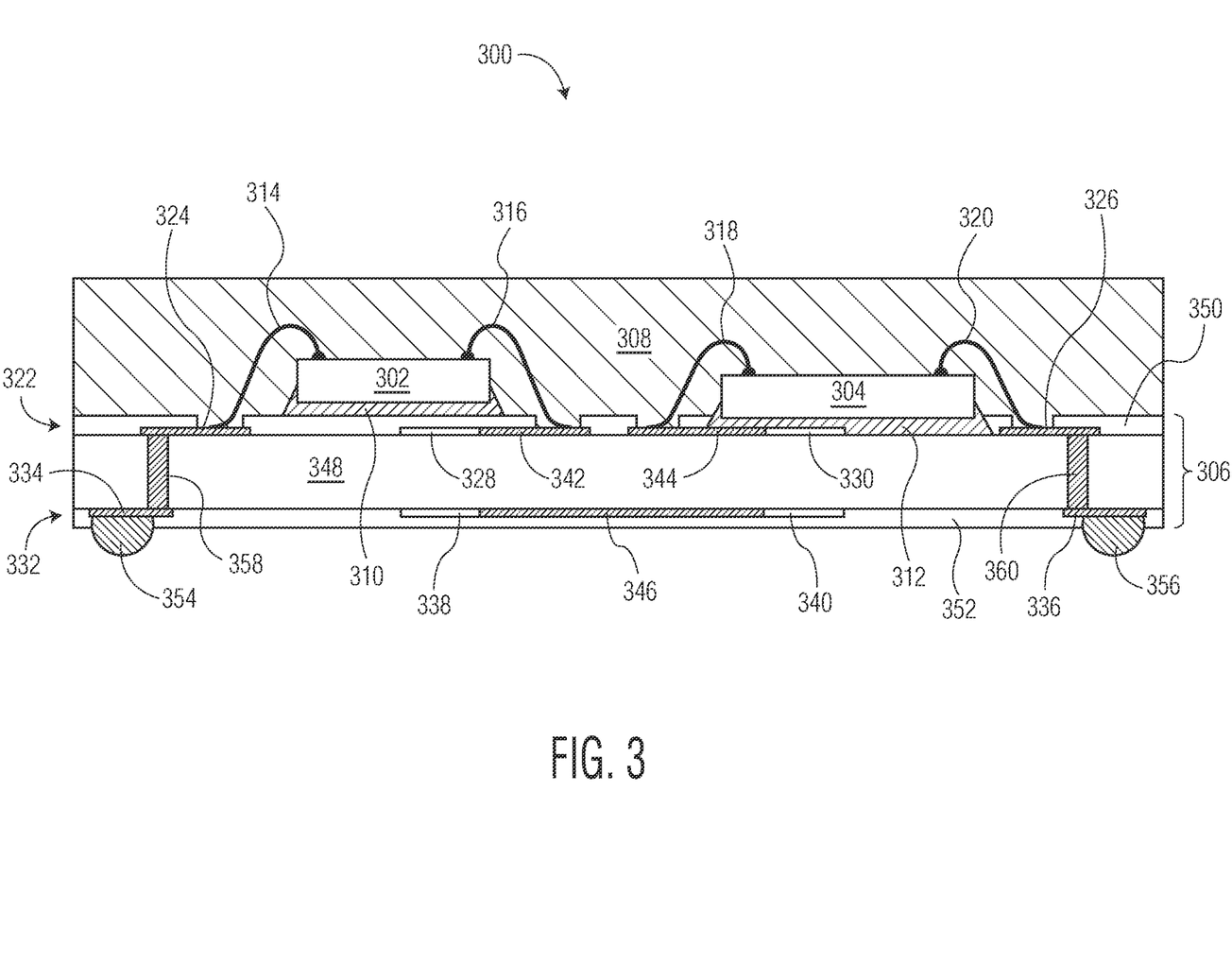
FIG. 3 illustrates, in a simplified cross-sectional view, an alternative example semiconductor device having galvanic isolation in accordance with an embodiment.

FIG. 3 illustrates, in a simplified cross-sectional view, an alternative example semiconductor device having galvanic isolation in accordance with an embodiment. In this embodiment, the device 300 includes a first semiconductor die 302 and a second semiconductor die 304 attached to a package substrate 306 and encapsulated with an encapsulant 308. A first inductive coupling within the package substrate 306 is formed by way of a first inductive coil 328 and a second inductive coil 338, and a second inductive coupling within the package substrate 306 is formed by way of a third inductive coil 330 and a fourth inductive coil 340. The first and second inductive couplings are connected in series to form a wireless communication link between the first semiconductor die 302 and the second semiconductor die 304. In this embodiment, the inductive coil 328 is located such that the semiconductor die 302 overlaps at least a portion of the inductive coil 328 and the inductive coil 330 is located such that the semiconductor die 304 overlaps at least a portion of the inductive coil 330. By locating the inductive coils 328 and 330 under the respective semiconductor die 302 and 304, overall package size and footprint can be minimized. In some embodiments, only one of the semiconductor die 302 and 304 may overlap one of the respective inductive coils 328 and 330.

The semiconductor die 302 has an active side and a backside. In this embodiment, the backside of the semiconductor die 302 is attached to the package substrate by way of die attach material 310. The semiconductor die 302 includes bond pads (not shown) at the active side configured for conductive connection to conductive features (e.g., conductive traces 324 and 342) of the package substrate 306 by way of bond wires 314 and 316, for example. The semiconductor die 302 may be formed from any suitable semiconductor material, such as silicon, germanium, gallium arsenide, gallium nitride, silicon carbide, and the like. In this embodiment, the semiconductor die 302 may be characterized as a low voltage die having an operating voltage in a first voltage domain sufficient for operation of CMOS digital circuitry, for example. In this embodiment, the semiconductor die 302 may serve as a controller device configured to control functions of the semiconductor die 304 by way of the wireless communication link.

The semiconductor die 304 has an active side and a backside. In this embodiment, the backside of the semiconductor die 304 is attached to the package substrate by way of die attach material 312. The semiconductor die 304 includes bond pads (not shown) at the active side configured for conductive connection to conductive features (e.g., conductive traces 344 and 326) of the package substrate 306 by way of bond wires 318 and 320, for example. The semiconductor die 304 may be formed from any suitable semiconductor material, such as silicon, germanium, gallium arsenide, gallium nitride, silicon carbide, and the like. In this embodiment, the semiconductor die 304 may be characterized as a high voltage die having an operating voltage in a second voltage domain different from the first voltage domain sufficient for operation of circuitry such as insulated-gate bipolar transistors (IGBT), for example. The second voltage domain may be electrically isolated and offset from the first voltage domain. In this embodiment, the semiconductor die 304 is configured for receiving commands from and/or transferring information with the semiconductor die 302 by way of the wireless communication link.

The package substrate 306 has a first major side and a second major side opposite of the first major side. In this embodiment, the package substrate 306 is formed as a multi-layer laminate structure. For example, the package substrate 306 includes a first conductive layer (e.g., metal) 322 located at the first major side and a second conductive layer 332 located at the second major side. The conductive layer 322 and the conductive layer 332 are separated by a non-conductive material (e.g., fiber reinforced epoxy material) 348. In this embodiment, the conductive layer 322 is patterned to form conductive traces 324-326, 342-344 and inductive coils 328-330. The conductive layer 332 is patterned to form conductive traces 334-336, 346 and inductive coils 338-340. The package substrate 306 may include any number of inductive coils 328-330 and 338-340 configured to form inductive coupling. Conductive vias 358 and 360 are formed to provide conductive connections between the conductive traces 324-326 and the conductive traces 334-336, for example. The inductive coil 328 and the inductive coil 338 are substantially aligned with one another within the package substrate 306 to allow for communication by way of inductive coupling. Likewise, the inductive coil 330 and the inductive coil 340 are substantially aligned with one another within the package substrate 306 to allow for communication by way of inductive coupling.

A first solder mask layer 350 is formed embedding the conductive traces 324-326, 342-344 and the inductive coils 328 and 330. Openings formed in the solder mask layer 350 expose portions of the conductive traces 324-326, 342-344 and conductive trace portions connected to the inductive coils 328 and 330 forming substrate pads. The exposed substrate pads allow for connections to the semiconductor die 302 and 304 by way of respective bond wires 314-320, for example. A second solder mask layer 352 is formed embedding the conductive traces 334-336, 346 and the inductive coils 338-340. Openings formed in the solder mask layer 352 expose portions of the conductive traces 334 and 336 forming connector pads to allow for connections to a printed circuit board (PCB) by way of respective ball connectors 354 and 356, for example. The ball connectors 354 and 356 may be any suitable conductive structure such as solder balls, gold studs, copper pillars, and the like, to connect conductive features of the device 300 with the PCB. In this embodiment, the package substrate 306 serves as a mechanical carrier, isolation barrier, and external interconnect for device 300.

The encapsulant 308 (e.g., epoxy molding compound) encapsulates the semiconductor die 302, the semiconductor die 304, the bond wires 314-320, and exposed portions of the top side of the package substrate 306. The encapsulated semiconductor die 302 and semiconductor die 304 are separated from one another by a distance sufficient to provide desired isolation. In this embodiment, the semiconductor die 302 and the semiconductor die 304 are separated by a predetermined distance to accommodate desired requirements.

In this embodiment, a wireless communication link is formed between semiconductor die 302 and semiconductor die 304 by way of the inductive coils 328-330 and 338-340 embedded in the package substrate 306. The communication link includes a signal path configured to allow wireless communication between the semiconductor die 302 and the semiconductor die 304 while being galvanically isolated from one another. For example, the signal path includes a first set of inductive coils 328 and 338 substantially aligned to form the first inductive coupling within the package substrate 306 and a second set of inductive coils 330 and 340 substantially aligned to form the second inductive coupling within the package substrate 306. Conductive trace 346 interconnects inductive coils 338 and 340 thus forming a series connection of the first set of inductive coils with the second set of inductive coils coupled between the semiconductor die 302 and the semiconductor die 304. The signal path further includes the bond wire 316 and conductive trace 342 interconnecting the semiconductor die 302 with the inductive coil 328 and bond wire 318 and conductive trace 344 interconnecting the semiconductor die 304 with the inductive coil 330.

Figure 4:
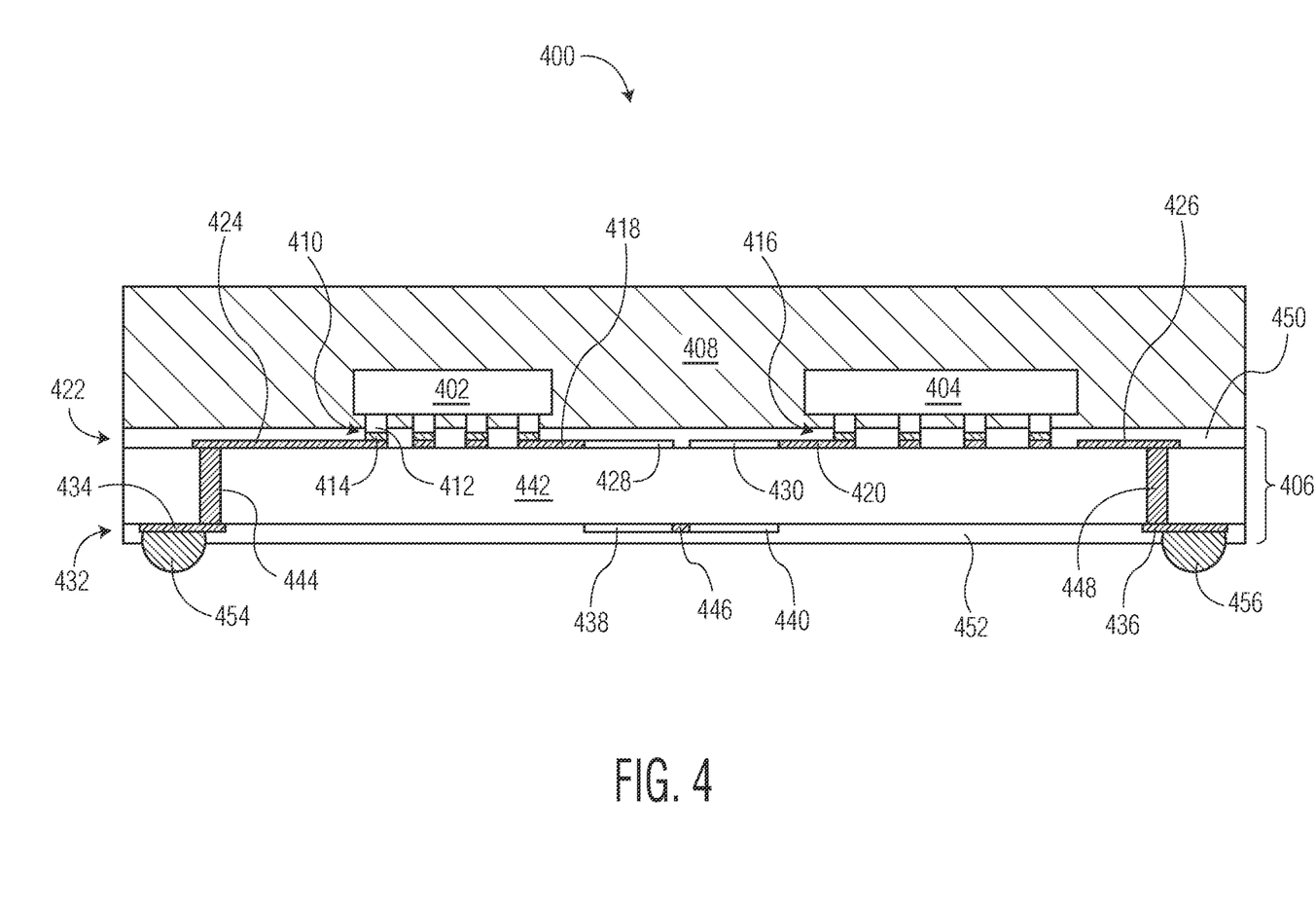
FIG. 4 illustrates, in a simplified cross-sectional view, an alternative example semiconductor device having galvanic isolation in accordance with an embodiment.

FIG. 4 illustrates, in a simplified cross-sectional view, an alternative example semiconductor device having galvanic isolation in accordance with an embodiment. In this embodiment, the device 400 includes a first semiconductor die 402 and a second semiconductor die 404 attached to a package substrate 406 and encapsulated with an encapsulant 408. A first inductive coupling within the package substrate 406 is formed by way of a first inductive coil 428 and a second inductive coil 438, and a second inductive coupling within the package substrate 406 is formed by way of a third inductive coil 430 and a fourth inductive coil 440. The first and second inductive couplings are connected in series to form a wireless communication link between the first semiconductor die 402 and the second semiconductor die 404. In this embodiment, the semiconductor die 402 and the semiconductor die 404 are oriented in a flip-chip (e.g., active side down) configuration. By orienting the first semiconductor die 402 and the second semiconductor die 404 in the flip-chip configuration, overall packaging complexity and costs can be reduced while improving performance and reliability. In some embodiments, only one of the semiconductor die 402 and 404 may be oriented in the flip-chip configuration.

The semiconductor die 402 has an active side and a backside. In this embodiment, the active side of the semiconductor die 402 is attached to the package substrate in a flip-chip configuration. The semiconductor die 402 includes bond pads (not shown) at the active side configured for conductive connection to conductive features of the package substrate 406 by way of conductive connectors 410 (e.g., copper pillars, gold studs, solder bumps, nanotubes), for example. The semiconductor die 402 may be formed from any suitable semiconductor material, such as silicon, germanium, gallium arsenide, gallium nitride, silicon carbide, and the like. In this embodiment, the semiconductor die 402 may be characterized as a low voltage die having an operating voltage in a first voltage domain sufficient for operation of CMOS digital circuitry, for example. In this embodiment, the semiconductor die 402 may serve as a controller device configured to control functions of the semiconductor die 404 by way of the wireless communication link.

The semiconductor die 404 has an active side and a backside. In this embodiment, the active side of the semiconductor die 404 is attached to the package substrate in a flip-chip configuration. The semiconductor die 404 includes bond pads (not shown) at the active side configured for conductive connection to conductive features of the package substrate 406 by way of conductive connectors 416 (e.g., copper pillars, gold studs, solder bumps, nanotubes), for example. The semiconductor die 404 may be formed from any suitable semiconductor material, such as silicon, germanium, gallium arsenide, gallium nitride, silicon carbide, and the like. In this embodiment, the semiconductor die 404 may be characterized as a high voltage die having an operating voltage in a second voltage domain different from the first voltage domain sufficient for operation of circuitry such as insulated-gate bipolar transistors (IGBT), for example. The second voltage domain may be electrically isolated and offset from the first voltage domain. In this embodiment, the semiconductor die 404 is configured for receiving commands from and/or transferring information with the semiconductor die 402 by way of the wireless communication link.

The package substrate 406 has a first major side and a second major side opposite of the first major side. In this embodiment, the package substrate 406 is formed as a multi-layer laminate structure. For example, the package substrate 406 includes a first conductive layer (e.g., metal) 422 located at the first major side and a second conductive layer 432 located at the second major side. The conductive layer 422 and the conductive layer 432 are separated by a non-conductive material (e.g., fiber reinforced epoxy material) 442. In this embodiment, the conductive layer 422 is patterned to form conductive traces 424-426, 418-420 and inductive coils 428-430. The conductive layer 432 is patterned to form conductive traces 434-436, 446 and inductive coils 438-440. The package substrate 406 may include any number of inductive coils 428-430 and 438-440 configured to form inductive coupling. Conductive vias 444 and 448 are formed to provide conductive connections between the conductive traces 424-426 and the conductive traces 434-436, for example. The inductive coil 428 and the inductive coil 438 are substantially aligned with one another within the package substrate 406 to allow for communication by way of inductive coupling. Likewise, the inductive coil 430 and the inductive coil 440 are substantially aligned with one another within the package substrate 406 to allow for communication by way of inductive coupling.

A first solder mask layer 450 is formed embedding the conductive traces 424-426, 418-420 and the inductive coils 428-430. Openings formed in the solder mask layer 450 expose substrate pads for connections to the semiconductor die 402 and 404 by way of respective conductive connectors 410 and 416, for example. A second solder mask layer 452 is formed embedding the conductive traces 434-436, 446 and the inductive coils 438-440. Openings formed in the solder mask layer 452 expose portions of the conductive traces 434 and 436 forming connector pads to allow for connections to a printed circuit board (PCB) by way of respective ball connectors 454 and 456, for example. The ball connectors 454 and 456 may be any suitable conductive structure such as solder balls, gold studs, copper pillars, and the like, to connect conductive features of the device 400 with the PCB. In this embodiment, the package substrate 406 serves as a mechanical carrier, isolation barrier, and external interconnect for device 400.

The encapsulant 408 (e.g., epoxy molding compound) encapsulates the semiconductor die 402, the semiconductor die 404, and exposed portions of the top side of the package substrate 406. The encapsulated semiconductor die 402 and semiconductor die 404 are separated from one another by a distance sufficient to provide desired isolation. In this embodiment, the semiconductor die 402 and the semiconductor die 404 are separated by a predetermined distance to accommodate desired requirements.

In this embodiment, a wireless communication link is formed between semiconductor die 402 and semiconductor die 404 by way of the inductive coils 428-430 and 438-440 embedded in the package substrate 406. The communication link includes a signal path configured to allow wireless communication between the semiconductor die 402 and the semiconductor die 404 while being galvanically isolated from one another. For example, the signal path includes a first set of inductive coils 428 and 438 substantially aligned to form the first inductive coupling within the package substrate 406 and a second set of inductive coils 430 and 440 substantially aligned to form the second inductive coupling within the package substrate 406. Conductive trace 446 interconnects inductive coils 438 and 440 thus forming a series connection of the first set of inductive coils with the second set of inductive coils coupled between the semiconductor die 402 and the semiconductor die 404. The signal path further includes the conductive connector 410 and conductive trace 418 interconnecting the semiconductor die 402 with the inductive coil 428 and conductive connector 416 and conductive trace 420 interconnecting the semiconductor die 404 with the inductive coil 430. In this embodiment, each of the conductive connectors 410 and 416 is formed as a copper pillar 412 with a solder plated tip 414.

Figure 5A:
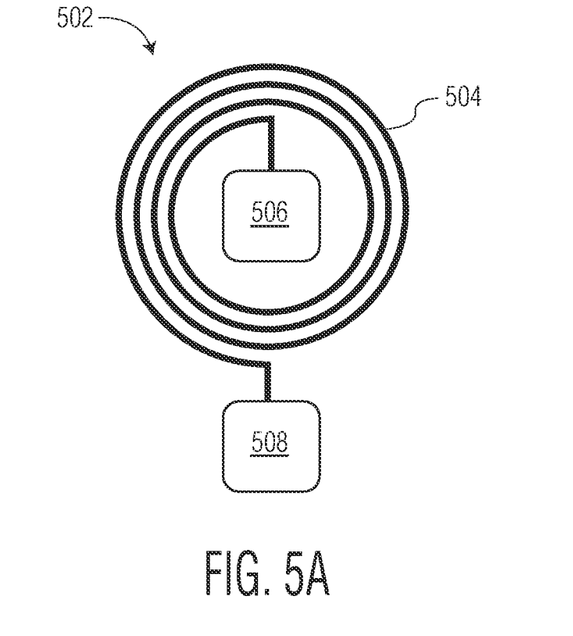
FIG. 5A through FIG. 5C illustrate, in simplified plan views, example inductive coils in accordance with an embodiment.
Figure 5B:
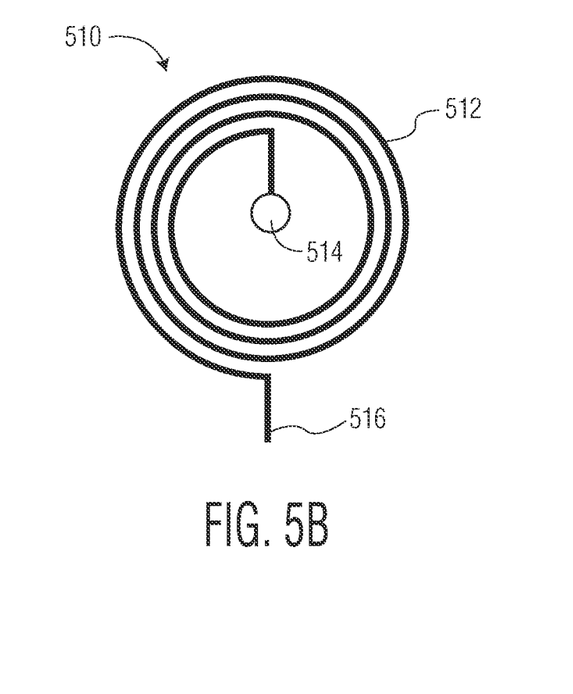
Figure 5C:
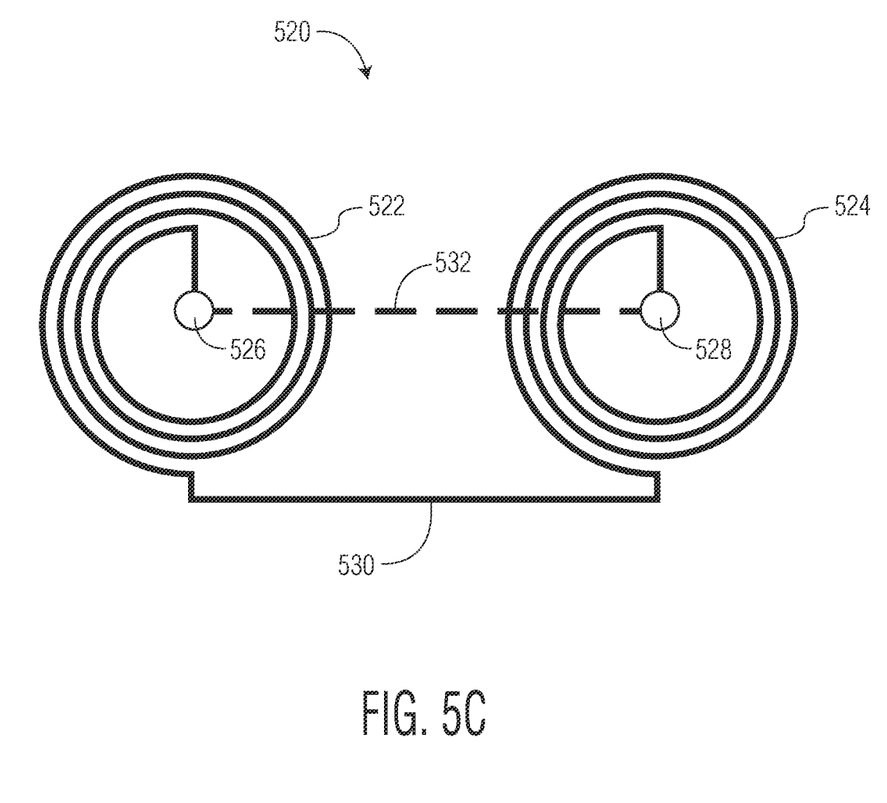

FIG. 5A through FIG. 5C illustrate, in simplified plan views, example inductive coils in accordance with an embodiment. An inductive coil 502 is depicted in FIG. 5A which corresponds to the inductive coils 130, 228, and 230, for example. The inductive coil 502 includes a spiral conductive trace 504 connected between terminals 506 and 508. The spiral conductive trace 504 may be formed having any suitable shape or pattern such as a circular spiral, square spiral, octagonal spiral, and others. In this embodiment, the spiral conductive trace 504 and terminals 506, 508 are formed from a same conductive layer (e.g., metal) of a laminate package substrate. In this embodiment, the terminals 506 and 508 include trace portions characterized as substrate pads having a shape and surface suitable for bond wire attachment. For example, the bond wire 118 interconnecting the semiconductor die 104 with the inductive coil 130 as depicted in FIG. 1 may have a first end connected at the semiconductor die 104 and a second end connected at the terminal 506. A second bond wire (not shown) interconnecting the semiconductor die 104 with a second terminal of the inductive coil 130 may have a first end connected at the semiconductor die 104 and a second end connected at the terminal 508.

An inductive coil 510 is depicted in FIG. 5B which corresponds to the inductive coils 140, 328-330, and 428-430, for example. The inductive coil 510 includes a spiral conductive trace 512 connected between terminal 514 and trace portion 516. The spiral conductive trace 512 may be formed having any suitable shape or pattern such as a circular spiral, square spiral, octagonal spiral, and others. In this embodiment, the spiral conductive trace 512, the terminal 514 and trace portion 516 are formed from a same conductive layer (e.g., metal) of a laminate package substrate. In this embodiment, the terminal 514 may be configured for connection to different conductive layer of the laminate package substrate by way of a conductive via. For example, interconnecting the semiconductor die 302 with the inductive coil 328 as depicted in FIG. 3 includes the bond wire 316 connected to a first portion of the conductive trace 342 with a second portion of the conductive trace 342 connected at the trace portion 516. A second terminal of the inductive coil 328 (e.g., terminal 514) may be interconnected to the semiconductor die 302 by way of a via connection to a different conductive layer of the laminate package substrate.

An inductive coil pair 520 is depicted in FIG. 5C which corresponds to the inductive coil pairs 238-240, 338-340, and 438-440 of FIG. 2 through FIG. 4, for example. The inductive coil pair 520 includes a first inductive coil formed as a spiral conductive trace 522 and a second inductive coil formed as a spiral conductive trace 524 connected by way of a conductive trace 530. Terminals 526 and 528 are configured for connection to each other by way of conductive vias interconnected to a conductive trace 532 (illustrated as a dashed line) formed on a different conductive layer of the laminate package substrate, for example. Each of the spiral conductive traces 522 and 524 may be formed having any suitable shape or pattern such as a circular spiral, square spiral, octagonal spiral, and others. In this embodiment, the spiral conductive traces 522, 524 and the terminals 526, 528 are formed from a same conductive layer (e.g., metal) of the laminate package substrate.

When the first and second inductive coils (e.g., corresponding to inductive coils 238 and 240 of FIG. 2) of the example inductive coil pair 520 are inductively coupled with respective third and fourth inductive coils (e.g., inductive coils 228 and 230 of FIG. 2), a series wireless link or communication path may be formed. For example, in the embodiment depicted in FIG. 2, a wireless communication signal path is formed between semiconductor die 202 and semiconductor die 204 by way of the series arrangement of inductive coils 228-230 and 238-240 embedded in the package substrate 206. The signal path includes a first inductive coupling formed by way of inductive coils 228 and 238 and a second inductive coupling formed by way of inductive coils 230 and 240.

Generally, there is provided, a semiconductor device including a package substrate having a first major side and a second major side; a first semiconductor die attached to the first major side of the package substrate; a second semiconductor die attached to the first major side of the package substrate; a first inductive coil formed at the first major side of the package substrate, the first inductive coil conductively interconnected to the first semiconductor die; and a second inductive coil formed at the second major side of the package substrate and substantially aligned with the first inductive coil, a first wireless communication link between the first semiconductor die and the second semiconductor die formed by way of the first and second inductive coils. The first inductive coil may be formed from a first conductive layer of the package substrate and the second inductive coil may be formed from a second conductive layer proximate to the second major side of the package substrate, the first conductive layer and the second conductive layer separated by a non-conductive material. The first semiconductor die may be configured for operation in a first voltage domain and the second semiconductor die may be configured for operation in a second voltage domain, the first voltage domain having voltage values different from the second voltage domain. The first inductive coil may be located at the first major side of the package substrate such that the first semiconductor die overlaps at least a portion of the first inductive coil. The first inductive coil may be conductively interconnected to the first semiconductor die by way of a first bond wire. Any of the first semiconductor die and the second semiconductor die may be attached to the first major side of the package substrate in a flip-chip orientation. The semiconductor device may further include a third inductive coil formed at the first major side of the package substrate, the third inductive coil conductively interconnected to the second semiconductor die; and a fourth inductive coil formed at the second major side of the package substrate and substantially aligned with the third inductive coil, a second wireless communication link formed by way of the third and fourth inductive coils, the second wireless communication link connected in series with the first wireless communication link between the first semiconductor die and the second semiconductor die. The semiconductor device may further include ball connectors attached to the second major side of the package substrate, the ball connectors configured to connect the semiconductor device package to a printed circuit board (PCB). A first subset of the ball connectors conductively interconnected to the first semiconductor die may be separated from a second subset of the ball connectors conductively interconnected to the second semiconductor die by a first distance, the first distance characterized as a clearance distance configured for high voltage isolation.

In another embodiment, there is provided, a method of manufacturing a semiconductor device including providing package substrate including a first inductive coil formed from a first conductive layer and a second inductive coil formed from a second conductive layer, the first conductive layer and the second conductive layer separated by a non-conductive material; attaching a first semiconductor die to a first major side of the package substrate, the first semiconductor die conductively interconnected to the first inductive coil; attaching a second semiconductor die attached to the first major side of the package substrate; and forming a first wireless communication link between the first semiconductor die and the second semiconductor die including the first and second inductive coils. The first conductive layer may be formed at the first major side of the package substrate and the second conductive layer may be formed at a second major side of the package substrate. The method may further include attaching a bond wire to conductively interconnect the first semiconductor die with the first inductive coil. Attaching the first semiconductor die to the first major side of the package substrate may include attaching the first semiconductor die such that the first semiconductor die overlaps at least a portion of the first inductive coil. Any of the first semiconductor die and the second semiconductor die may be attached to the first major side of the package substrate in a flip-chip orientation. The method may further include forming a second wireless communication link including a third inductive coil and a fourth inductive coil, the second wireless communication link connected in series with the first wireless communication link between the first semiconductor die and the second semiconductor die.

In yet another embodiment, there is provided, a semiconductor device including a package substrate including a first inductive coil formed from a first conductive layer and a second inductive coil formed from a second conductive layer, the first conductive layer and the second conductive layer separated by a non-conductive material; a first semiconductor die attached to a first major side of the package substrate, the first semiconductor die conductively interconnected to the first inductive coil; a second semiconductor die attached to the first major side of the package substrate; and a first wireless communication link between the first semiconductor die and the second semiconductor die formed by way of the first and second inductive coils. The first semiconductor die may be configured for operation in a first voltage domain and the second semiconductor die may be configured for operation in a second voltage domain, the first voltage domain having voltage values different from the second voltage domain. The first inductive coil may be located at the first major side of the package substrate such that the first semiconductor die overlaps at least a portion of the first inductive coil. The first inductive coil may be conductively interconnected to the first semiconductor die by way of a bond wire. The semiconductor device may further include a third inductive coil formed from the first conductive layer, the third inductive coil conductively interconnected to the second semiconductor die; and a fourth inductive coil formed from the second conductive layer and substantially aligned with the third inductive coil, a second wireless communication link formed by way of the third and fourth inductive coils, the second wireless communication link connected in series with the first wireless communication link between the first semiconductor die and the second semiconductor die.

By now, it should be appreciated that there has been provided a semiconductor device package having galvanic isolation. The packaged semiconductor device includes a first semiconductor die and a second semiconductor die attached to a package substrate. The two semiconductor die are configured to communicate and/or transfer power with one another by way of inductive coils located in the package substrate. In this manner, the two semiconductor die are isolated from one another such that if an electrical over stress (EOS) event damaged the first semiconductor die, the second semiconductor die would remain electrically isolated from the first semiconductor die.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a package substrate having a first major side and a second major side;
   a first semiconductor die attached to the first major side of the package substrate;
   a second semiconductor die attached to the first major side of the package substrate;
   a first inductive coil formed at the first major side of the package substrate, the first inductive coil conductively interconnected to the first semiconductor die; and
   a second inductive coil formed at the second major side of the package substrate and substantially aligned with the first inductive coil, a first wireless communication link between the first semiconductor die and the second semiconductor die formed by way of the first and second inductive coils;
   wherein the first inductive coil is formed from a first conductive layer of the package substrate and the second inductive coil is formed from a second conductive layer proximate to the second major side of the package substrate, the first conductive layer and the second conductive layer separated by a non-conductive material.

2. The semiconductor device of claim 1, wherein the first semiconductor die is configured for operation in a first voltage domain and the second semiconductor die is configured for operation in a second voltage domain, the first voltage domain having voltage values different from the second voltage domain.

3. The semiconductor device of claim 1, wherein the first inductive coil is located at the first major side of the package substrate such that the first semiconductor die overlaps at least a portion of the first inductive coil.

4. The semiconductor device of claim 1, wherein the first inductive coil is conductively interconnected to the first semiconductor die by way of a first bond wire.

5. The semiconductor device of claim 1, wherein any of the first semiconductor die and the second semiconductor die is attached to the first major side of the package substrate in a flip-chip orientation.

6. The semiconductor device of claim 1, further comprising:
   a third inductive coil formed at the first major side of the package substrate, the third inductive coil conductively interconnected to the second semiconductor die; and
   a fourth inductive coil formed at the second major side of the package substrate and substantially aligned with the third inductive coil, a second wireless communication link formed by way of the third and fourth inductive coils, the second wireless communication link connected in series with the first wireless communication link between the first semiconductor die and the second semiconductor die.

7. The semiconductor device of claim 1, further comprising ball connectors attached to the second major side of the package substrate, the ball connectors configured to connect the semiconductor device package to a printed circuit board (PCB).

8. The semiconductor device of claim 7, wherein a first subset of the ball connectors conductively interconnected to the first semiconductor die is separated from a second subset of the ball connectors conductively interconnected to the second semiconductor die by a first distance, the first distance characterized as a clearance distance configured for high voltage isolation.

9. A method of manufacturing a semiconductor device, the method comprising:
providing a package substrate including a first inductive coil formed from a first conductive layer formed at a first major side of the package substrate and a second inductive coil formed from a second conductive layer formed at a second major side of the package substrate, the first conductive layer and the second conductive layer separated by a non-conductive material;
attaching a first semiconductor die to the first major side of the package substrate, the first semiconductor die conductively interconnected to the first inductive coil;
attaching a second semiconductor die attached to the first major side of the package substrate; and
forming a first wireless communication link between the first semiconductor die and the second semiconductor die including the first and second inductive coils.

10. The method of claim 9, further comprising attaching a bond wire to conductively interconnect the first semiconductor die with the first inductive coil.

11. The method of claim 9, wherein attaching the first semiconductor die to the first major side of the package substrate comprises attaching the first semiconductor die such that the first semiconductor die overlaps at least a portion of the first inductive coil.

12. The method of claim 9, wherein any of the first semiconductor die and the second semiconductor die is attached to the first major side of the package substrate in a flip-chip orientation.

13. The method of claim 9, further comprising forming a second wireless communication link including a third inductive coil and a fourth inductive coil, the second wireless communication link connected in series with the first wireless communication link between the first semiconductor die and the second semiconductor die.

14. A semiconductor device comprising:
a package substrate including a first inductive coil formed from a first conductive layer formed at a first major side of the package substrate and a second inductive coil formed from a second conductive layer formed at a second major side of the package substrate, the first conductive layer and the second conductive layer separated by a non-conductive material;
a first semiconductor die attached to the first major side of the package substrate, the first semiconductor die conductively interconnected to the first inductive coil;
a second semiconductor die attached to the first major side of the package substrate; and
a first wireless communication link between the first semiconductor die and the second semiconductor die formed by way of the first and second inductive coils.

15. The semiconductor device of claim 14, wherein the first semiconductor die is configured for operation in a first voltage domain and the second semiconductor die is configured for operation in a second voltage domain, the first voltage domain having voltage values different from the second voltage domain.

16. The semiconductor device of claim 14, wherein the first inductive coil is located at the first major side of the package substrate such that the first semiconductor die overlaps at least a portion of the first inductive coil.

17. The semiconductor device of claim 14, wherein the first inductive coil is conductively interconnected to the first semiconductor die by way of a bond wire.

18. The semiconductor device of claim 14, further comprising:
a third inductive coil formed from the first conductive layer, the third inductive coil conductively interconnected to the second semiconductor die; and
a fourth inductive coil formed from the second conductive layer and substantially aligned with the third inductive coil, a second wireless communication link formed by way of the third and fourth inductive coils, the second wireless communication link connected in series with the first wireless communication link between the first semiconductor die and the second semiconductor die.

19. A semiconductor device comprising:
a package substrate having a first major side and a second major side;
a first semiconductor die attached to the first major side of the package substrate, the first semiconductor die configured for operation in a first voltage domain;
a second semiconductor die attached to the first major side of the package substrate, the second semiconductor die configured for operation in a second voltage domain, the first voltage domain having voltage values different from the second voltage domain;
a first inductive coil formed at the first major side of the package substrate, the first inductive coil conductively interconnected to the first semiconductor die; and
a second inductive coil formed at the second major side of the package substrate and substantially aligned with the first inductive coil, a first wireless communication link between the first semiconductor die and the second semiconductor die formed by way of the first and second inductive coils.

20. A semiconductor device comprising:
a package substrate including a first inductive coil formed from a first conductive layer and a second inductive coil formed from a second conductive layer, the first conductive layer and the second conductive layer separated by a non-conductive material;
a first semiconductor die attached to a first major side of the package substrate, the first semiconductor die conductively interconnected to the first inductive coil, the first semiconductor die configured for operation in a first voltage domain;
a second semiconductor die attached to the first major side of the package substrate, the second semiconductor die configured for operation in a second voltage domain, the first voltage domain having voltage values different from the second voltage domain; and
a first wireless communication link between the first semiconductor die and the second semiconductor die formed by way of the first and second inductive coils.

* * * * *